(12) United States Patent
Freedman et al.

(10) Patent No.: US 7,394,092 B2
(45) Date of Patent: Jul. 1, 2008

(54) QUASI-PARTICLE INTERFEROMETRY FOR LOGICAL GATES

(75) Inventors: Michael H. Freedman, Redmond, WA (US); Chetan V. Navak, Santa Monica, CA (US); Sankar Das Sarma, Potomac, MD (US)

(73) Assignee: Microsoft Corporation, Redmond, WA (US)

( * ) Notice: Subject to any disclaimer, the term of this patent is extended or adjusted under 35 U.S.C. 154(b) by 0 days.

(21) Appl. No.: 11/544,492

(22) Filed: Oct. 6, 2006

(65) Prior Publication Data

US 2008/0129328 A1 Jun. 5, 2008

Related U.S. Application Data

(62) Division of application No. 11/233,653, filed on Sep. 23, 2005, now Pat. No. 7,250,624.

(51) Int. Cl.
*H01L 29/06* (2006.01)

(52) U.S. Cl. ................ 257/14; 257/11; 257/9; 257/E43.002; 257/E43.007; 338/32

(58) Field of Classification Search ........................ None
See application file for complete search history.

(56) References Cited

U.S. PATENT DOCUMENTS

2002/0199108 A1   12/2002   Chuang et al. .............. 713/176

OTHER PUBLICATIONS

Das Sarma et al., Topologically-Protected Qubits from a Possible Non-Abelian Fractional Quantum Hall State, Dec. 22, 2004, http://arXiv.org/abs/cond-mat/0412343.*

Freedman, M.H. et al., "A Modular Functor which is Universal for Quantum Computation", *Commun. Math. Phys.*, 2002, 227, 605-622.

Goldman, V.J. et al., "Resonant tunneling in the Quantum Hall Regime: Measurement of Fractional Charge", *Science*, 1995, 267, 1010-1012.

Greiter, M. et al., "Paired Hall State at Half Filling", *Physical Review Letters*, 1991, 66(24), 3205-3208.

Moore, G. et al., "Nonabelions in the Fractional Quantum Hall Effect", *Nuclear Physics*, 1991, B360, 362-396.

Nayak, C. et al., "2n-quasihole States Realize 2n-1-Dimensional Spinor Braiding Statistics in Paired Quantum Hall States", *Nuclear Physics*, 1996, B479, 529-553.

* cited by examiner

*Primary Examiner*—A. Sefer
*Assistant Examiner*—Scott R Wilson
(74) *Attorney, Agent, or Firm*—Woodcock Washburn LLP

(57) ABSTRACT

A quantum computer can only function stably if it can execute gates with extreme accuracy. "Topological protection" is a road to such accuracies. Quasi-particle interferometry is a tool for constructing topologically protected gates. Assuming the corrections of the Moore-Read Model for $v=5/2$'s FQHE (Nucl. Phys. B 360, 362 (1991)) we show how to manipulate the collective state of two e/4-charge anti-dots in order to switch said collective state from one carrying trivial SU(2) charge, $|1\rangle$, to one carrying a fermionic SU(2) charge $|\in\rangle$. This is a NOT gate on the $\{|1\rangle, |\in\rangle\}$ qubit and is effected by braiding of an electrically charged quasi particle a which carries an additional SU(2)-charge. Read-out is accomplished by $\sigma$-particle interferometry.

8 Claims, 3 Drawing Sheets

QUASI-PARTICLE INTERFEROMETRY FOR LOGICAL GATES

CROSS-REFERENCE TO RELATED APPLICATIONS

This application is a division of U.S. patent application Ser. No. 11/233,653, filed Sep. 23, 2005 now U.S. Pat. No. 7,250,624, the disclosure of which is incorporated herein by reference.

GOVERNMENT RIGHTS

This invention was supported in part by funds from the U.S. Government (National Science Foundation Grant No. DMR-0411800 and Army Research Office Grant No. W911NF-04-1-236). The U.S. Government, therefore, may have certain rights in this invention.

BACKGROUND OF THE INVENTION

Since the discovery of the fractional quantum Hall effect (FQHE) in 1982, topological phases of electrons have been a subject of great interest. Many abelian topological phases have been discovered in the context of the quantum Hall regime. More recently, high-temperature superconductivity and other complex materials have provided the impetus for further theoretical studies of and experimental searches for abelian topological phases. The types of microscopic models admitting such phases are now better understood. Much less is known about non-abelian topological phases. They are reputed to be obscure and complicated, and there has been little experimental motivation to consider non-abelian topological phases. However, non-abelian topological states would be an attractive milieu for quantum computation.

It has become increasingly clear that if a new generation of computers could be built to exploit quantum mechanical superpositions, enormous technological implications would follow. In particular, solid state physics, chemistry, and medicine would have a powerful new tool, and cryptography also would be revolutionized.

The standard approach to quantum computation is predicated on the quantum bit ("qubit") model in which one anticipates computing on a local degree of freedom such as a nuclear spin. In a qubit computer, each bit of information is typically encoded in the state of a single particle, such as an electron or photon. This makes the information vulnerable. If a disturbance in the environment changes the state of the particle, the information is lost forever. This is known as decoherence—the loss of the quantum character of the state (i.e., the tendency of the system to become classical). All schemes for controlling decoherence must reach a very demanding and possibly unrealizable accuracy threshold to function.

Topology has been suggested to stabilize quantum information. A topological quantum computer would encode information not in the conventional zeros and ones, but in the configurations of different braids, which are similar to knots but consist of several different threads intertwined around each other. The computer would physically weave braids in space-time, and then nature would take over, carrying out complex calculations very quickly. By encoding information in braids instead of single particles, a topological quantum computer does not require the strenuous isolation of the qubit model and represents a new approach to the problem of decoherence.

In 1997, there were independent proposals by Kitaev and Freedman that quantum computing might be accomplished if the "physical Hilbert space" V of a sufficiently rich TQFT (topological quantum field theory) could be manufactured and manipulated. Hilbert space describes the degrees of freedom in a system. The mathematical construct V would need to be realized as a new and remarkable state for matter and then manipulated at will.

The computational power of a quantum mechanical Hilbert space is potentially far greater than that of any classical device. However, it is difficult to harness it because much of the quantum information contained in a system is encoded in phase relations which one might expect to be easily destroyed by its interactions with the outside world ("decoherence" or "error"). Therefore, error-correction is particularly important for quantum computation. Fortunately, it is possible to represent information redundantly so that errors can be diagnosed and corrected.

An interesting analogy with topology suggests itself: local geometry is a redundant way of encoding topology. Slightly denting or stretching a surface such as a torus does not change its genus, and small punctures can be easily repaired to keep the topology unchanged. Only large changes in the local geometry change the topology of the surface. Remarkably, there are states of matter for which this is more than just an analogy. A system with many microscopic degrees of freedom can have ground states whose degeneracy is determined by the topology of the system. The excitations of such a system have exotic braiding statistics, which is a topological effective interaction between them. Such a system is said to be in a topological phase. The unusual characteristics of quasiparticles in such states can lead to remarkable physical properties, such as a fractional quantized Hall conductance. Such states also have intrinsic fault-tolerance. Since the ground states are sensitive only to the topology of the system, interactions with the environment, which are presumably local, cannot cause transitions between ground states unless the environment supplies enough energy to create excitations which can migrate across the system and affect its topology. When the temperature is low compared to the energy gap of the system, such events will be exponentially rare.

A different problem now arises: if the quantum information is so well-protected from the outside world, then how can we—presumably part of the outside world—manipulate it to perform a computation? The answer is that we must manipulate the topology of the system. In this regard, an important distinction must be made between different types of topological phases. In the case of those states which are Abelian, we can only alter the phase of the state by braiding quasiparticles. In the non-Abelian case, however, there will be a set of g>1 degenerate states, $\psi_a$, a=1, 2, ..., g of particles at $x_1$, $x_2, \ldots, x_n$. Exchanging particles 1 and 2 might do more than just change the phase of the wave function. It might rotate it into a different one in the space spanned by the $\omega_a$S:

$$\psi_a \to M_{ab}^{12} \psi_b \qquad (1)$$

On the other hand, exchanging particles 2 and 3 leads to $\psi_a \to M_{ab}^{23} \psi_b$. If $M_{ab}^{12}$ and $M_{ab}^{23}$ do not commute (for at least some pairs of particles), then the particles obey non-Abelian braiding statistics. In the case of a large class of states, the repeated application of raiding transformations $M^{abij}$ allows one to approximate any desired unitary transformation to arbitrary accuracy and, in this sense, they are universal quantum computers. Unfortunately, no non-Abelian topological states have been unambiguously identified so far.

Some proposals have been put forward for how such states might arise in highly frustrated magnets, where such states might be stabilized by very large energy gaps on the order of magnetic exchange couplings, but the best prospects in the short run are in quantum Hall systems, where Abelian topological phases are already known to exist.

The best candidate is the quantized Hall plateau with $$\sigma_{ab} = \frac{5}{2} \frac{e^2}{h}.$$

The 5/2 fractional quantum Hall state (as well as its particle-hole symmetric analog, the 7/2 state) is now routinely observed in high-quality (i.e., low-disorder) samples. In addition, extensive numerical work using finite-size diagonalization and wavefunction overlap calculations indicates that the 5/2 state belongs to the non-Abelian topological phase characterized by a Pfaffian quantum Hall wavefunction. The set of transformations generated by braiding quasiparticle excitations in the Pfaffian state is not computationally universal (i.e., is not dense in the unitary group), but other non-Abelian states in the same family are. Thus, it is important to (a) determine if the $$v = \frac{5}{2}$$

state is, indeed, the Pfaffian universality class and, if so, to (b) use it to store and manipulate quantum information.

SUMMARY OF THE INVENTION

An experimental device as described herein can address both of the aforementioned determinations. Features of such a device are inspired by anti-dot experiments measuring the charge of quasiparticles in Abelian fractional quantum Hall states such as $$v = \frac{1}{3}$$

and proposals for measuring their statistics. Our measurement procedure relies upon quantum interference as in the electronic Mach-Zehnder interferometer in which Aharonov-Bohm oscillations were observed in a two dimensional electron gas.

In order to establish which topological phase the $$v = \frac{5}{2}$$

plateau is in, one must directly measure quasiparticle braiding statistics. Remarkably, this has never been done even in the case of the usual $$v = \frac{1}{3}$$

quantum Hall plateau (although in this case, unlike in the $$v = \frac{5}{2}$$

case, computational solutions of small systems leave little doubt about which topological phase the plateau is in). Part of the problem is that it is difficult to disentangle the phase associated with braiding from the phase which charged particles accumulate in a magnetic field. Ironically, it may actually be easier to measure the effect of non-Abelian braiding statistics because it is not just a phase and is therefore qualitatively different from the effect of the magnetic field.

A logical gate according to the invention enables the manipulation of a collective quantum state of one or more anti-dots disposed in a fractional quantum Hall effect (FQHE) fluid. A FQHE fluid is an exotic form of matter that arises when electrons at the flat interface of two semiconductors are subjected to a powerful magnetic field and cooled to temperatures close to absolute zero. The electrons on the flat surface form a disorganized liquid sea of electrons, and if some extra electrons are added, quasi-particles called anyons emerge. Quasi-particles are excitations of electrons, and, unlike electrons or protons, anyons can have a charge that is a fraction of a whole number.

Anti-dots are "holes" in the FQHE fluid created by charge, i.e., islands of higher potential where the FQHE fluid does not exist. Anti-dots are not quasi particles, per se, but can have a quasi-particle charge. The collective quantum state of the one or more anti-dots may be a state carrying trivial SU(2) charge |1>, or a state carrying a fermionic SU(2) charge |∈>.

The collective state of the quasi-particles may be read out by drawing an output current out of the quantum Hall fluid. The value of the output current will indicate whether the collective state is |1> or |∈>. The state can be the state of a single anti-dot, or the collective state of two or more anti-dots.

To operate the logical gate, i.e., to flip between states |1> and |∈>, a σ quasi-particle may be caused to tunnel by adjusting the electrical potential on conductive gates that are provided for adjusting electrical potentials confining a fractional quantum Hall fluid. Tunneling of the quasi-particle may deform the contours of the FQHE fluid. It should be understood that quasi-particles tunnel more easily than electrons because quasi-particles have less charge being in essence electron fractions.

As described in detail below, quasi-particle interferometry by electrically charged particles may be used to build logical gates and read out for quantum computers, as realized in a system for implementing a NOT-gate in v=5/2 FQHE systems.

DETAILED DESCRIPTION OF ILLUSTRATIVE EMBODIMENTS

Figure 1D:
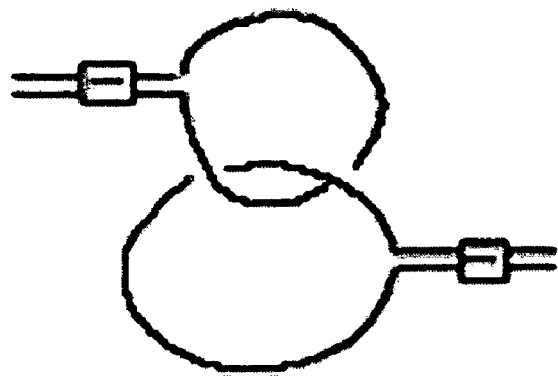
FIGS. 1A-1D depict links formed by taking a quasiparticle around a qubit pair.
Figure 1C:
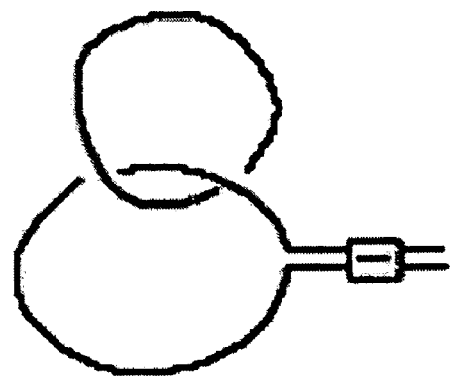
Figure 1B:
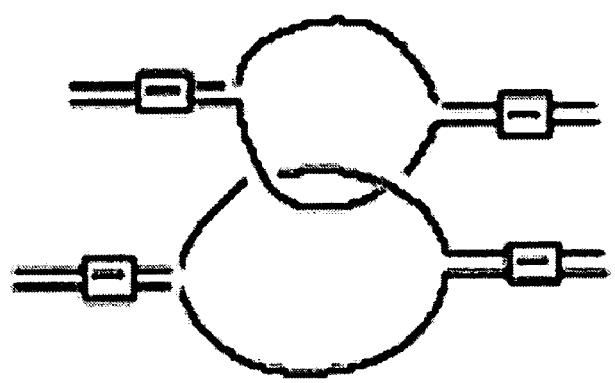
Figure 1A:
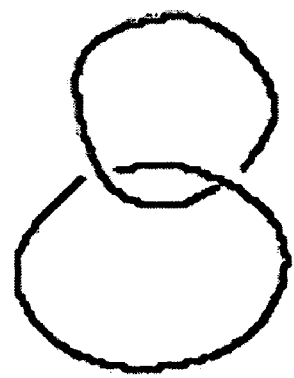

The Pfaffian state may be viewed as a quantum Hall state of p-wave paired fermions. The quasiparticles in this phase have charge $-e/4$ (not $e/2$, as one might naively assume from the Landau-level filling fraction $$\nu = 2 + \frac{1}{2};$$

this emphasizes the importance of an experiment, such as described in V. J. Goldman and B. Su, Science 267, 1010 (1995), to measure the quasiparticle charge at $$\nu = \frac{5}{2}).$$

When there are 2n quasiparticles at fixed positions in the system, there is a $2^{n-1}$-dimensional degenerate space of states. Exchanging and braiding quasiparticles is related to the action of the 2n-dimensional Clifford algebra on this space, as has recently been confirmed by direct numerical evaluation of the Berry matrices. In particular, two charge $-e/4$ quasiparticles can "fuse" to form a charge $-e/2$ quasiparticle either with or without a neutral fermion in its core. One may view the charge $-e/2$ quasiparticle as the quantum Hall incarnation of a superconducting vortex with a fermionic zero mode in its core. We will regard the presence or absence of a neutral fermion in this core state if the two charge $-e/4$ quasiparticles were fused as our qubit. So long as the two quasiparticles are kept far apart, the neutral fermion is not localized anywhere and, therefore, the qubit is unmeasurable by any local probe or environment. However, we can measure the qubit by encircling it with a charge $-e/4$ quasiparticle. The presence of the neutral fermion causes the state to acquire an extra factor of $-1$ during this process. The qubit can also be manipulated by taking another charge $-e/4$ quasiparticle between the two charge $-e/4$ quasiparticles comprising the qubit, i.e., around one but not the other. Such a process transforms a state without a neutral fermion into a state with one and vice versa. Thus, it flips the qubit (and also multiplies by i). By performing an experiment which measures this qubit, flips it, and then re-measures it, we can demonstrate that the $$\nu = \frac{5}{2}$$

state is in a non-Abelian topological phase. A few additional similar experiments may be necessary to fully nail down that it is in the Pfaffian phase rather than another non-Abelian phase. Such an experiment can only work if the environment does not flip the qubit before we have a chance to measure it, so the success of this experiment would demonstrate the stability of a topological qubit in a non-Abelian quantum Hall state. By varying the time between measurements, one could determine the decoherence time of the qubit in order to quantitatively compare it with other approaches to quantum computation.

The claimed quasiparticle braiding properties can be seen from the form of the four-quasihole wavefunctions given in C. Nayak and F. Wilczek, Nucl. Phys. B 479, 529 (1996). The ground state wavefunction takes the form $$\Psi_{g.s.}(z_j) = \prod_{j<k}(z_j - z_k)^2 \prod_j e^{-|z_j|^2/4} \cdot Pf\left(\frac{1}{z_j - z_k}\right). \quad (2)$$

where the Pfaffian is the square root of the determinant of an antisymmetric matrix. If we write $$\Psi_{(13)(24)}(z_j) = \prod_{j<k}(z_j - z_k)^2 \quad (3)$$

$$\prod_j e^{-|z_j|^2/4} \times Pf\left(\frac{(z_j - \eta_1)(z_j - \eta_3)(z_k - \eta_2)(z_k - \eta_4) + (j \leftrightarrow k)}{z_j - z_k}\right)$$

and similarly for $\Psi_{(14)(23)}$, then the four-quasihole wavefunctions can be written in a basis in which their braiding is completely explicit:

$$\Psi^{(0,1)}(z_j) = \frac{(\eta_{13}\eta_{24})^{\frac{1}{4}}}{(1 \pm \sqrt{x})^{\frac{1}{2}}}(\Psi_{(13)(24)} \pm \sqrt{x}\,\Psi_{(14)(23)}) \quad (4)$$

where $\eta_{13} = \eta_1 - \eta_3$, etc. and $$x = \frac{\eta_{14}\eta_{23}}{\eta_{13}\eta_{24}}.$$

Let us suppose that the quasiholes at $\eta_1$ and $\eta_2$ form our qubit. The quasiholes at $\eta_3$ and $\theta_4$ will be used to measure and manipulate them. From (4), we see that taking $\eta_3$ around $\eta_1$ and $\eta_2$ results in a factor i in the state $\Psi^{(0)}$ but $-i$ in the state $\Psi^{(1)}$. Taking $\eta_3$ around either $\eta_1$ or $\eta_2$ (but not both) transforms $\Psi_{(0)}$ into $i\Psi^{(1)}$ and vice versa.

As shown in FIGS. 1A-1D, it is also possible to verify the logic associated to braiding operations using a few formal properties of the Jones polynomial at $q=\exp(\pi i/4)$. Taking one quasiparticle around the qubit pair (i.e., "linking") results in an extra $-1$ if the qubit is in state $|1>$ (a factor $d=-q-q^{-1}$ also arises regardless of whether or not the quasiparticle encircles the qubit). The boxed "1" is a projector on the pair of quasiparticles that puts them in the state $|1>$. By evaluating the Jones polynomial at $q=\exp(\pi i/4)$ for these links, desired matrix elements for braiding operations manipulating the qubit can be obtained. The Jones polynomial (operator) at $q=\exp(\pi i/4)$ vanishes for the links in FIGS. 1A and 1B by calculation, and for the links in FIG. 1C by parity. The Jones polynomial at $q=\exp(\pi i/4)$ is non-vanishing only for the links in FIG. 1D, which applies to all processes with topologically-equivalent link diagrams, e.g., interchanging inputs/outputs so, for example, FIG. 1D corresponds to four different processes. In the links depicted in FIG. 1D, the qubit is flipped by the elementary braid operation.

Figure 2:
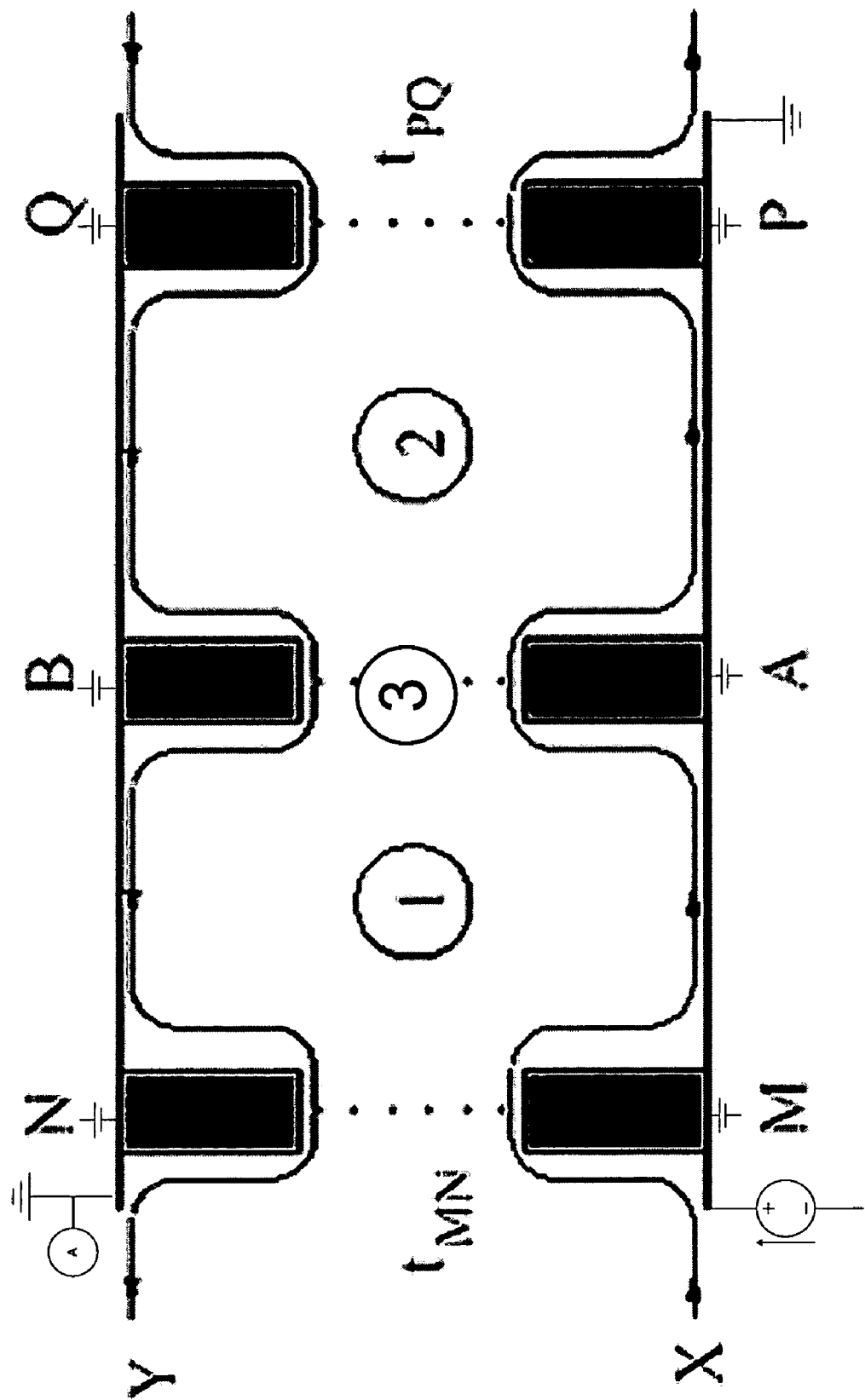
FIG. 2 depicts an example embodiment of a NOT gate for a quantum computer.

FIG. 2 depicts a plan view of an example embodiment of a NOT gate according to the invention. The basic setup which is proposed is a quantum Hall bar with two individually-gated anti-dots in its interior, labeled 1 and 2 in FIG. 2. The plan view shown in FIG. 2 may be about 3-5 μm×about 3-5 μm. A fractional quantum Hall effect (FQHE) fluid (which may include some 10 million electrons, for example, may be formed in a gallium arsenide hetero-junction, i.e., at a crystal interface between a gallium arsenide crystal, for example, and an aluminum gallium arsenide crystal.

Electrically-conductive gates enable tunneling between the two edges at M, N and P,Q, thereby allowing a measurement of the qubit formed by the correlation between anti-dots 1 and 2. Electrically-conductive gates also allow tunneling at A, B that flips the qubit. An electrical potential may be applied to enable tunneling of quasi-particles between A and B. It may be useful to have a third anti-dot 3 disposed between A and B in order to precisely control the charge which tunnels between A and B. Because there is only a probability that a tunneling event will occur, the anti-dot between A and B may be used to indicate whether a tunneling event has actually occurred. One can determine whether a tunneling event has occurred by using coulomb blockade, for example, or some other experimental method to "watch" an e/4 charge first jump on and then jump off the anti-dot disposed between gates A and B. It should be understood that the gates may be front gates (i.e., gates disposed on top of the crystal) or back gates (gates disposed on the bottom of the crystal). If back gates are used, the potential would be the opposite of that used with front gates.

There are three basic procedures which we would like to execute: (1) initialize the qubit and measure its initial state, (2) flip the qubit, and (3) measure it again. In order to initialize the qubit, we first put charge e/2 on one of the anti-dots, say 1. Since the fermionic zero mode is now localized on this anti-dot, the environment will "measure" it, and it will either be occupied or unoccupied (not a superposition of the two). We can determine which state it is in by applying voltage to the front gates at M and N and at P and Q so that tunneling can occur there with amplitudes $t_{MN}$ and $t_{PQ}$. The longitudinal conductivity, $\sigma_{xx}$ is determined by the probability for current entering the bottom edge at X in FIG. 2 to exit along the top edge at Y. This is given, to lowest order in $t_{MN}$ and $t_{PQ}$, by the interference between two processes: one in which a quasiparticle tunnels from M to N, and another in which the quasiparticle instead continues along the bottom edge to P, tunnels to Q, and then moves along the top edge to N. We subsume into $t_{PQ}$ the phase associated with the extra distance traveled in the second process. The relative phase of these processes depends on the state of the qubit. If a neutral fermion is not present, which we will denote by |0>, then $\sigma_{xx} \propto |t_{MN}+i\ t_{PQ}|^2$. If it is present, however, which we denote by |1), then $\sigma_{xx} \propto |t_{MN}-i\ t_{PQ}|^2$. We take the visibility of Aharonov-Bohm oscillations in a device with similar limitations (e.g., the possibility of the tunneling quasiparticles becoming dephased by their interaction with localized two-level systems) as an indication that our proposed read-out procedure will work.

Without loss of generality, let us suppose that the initial state of the qubit is 10). Now, let us apply voltage to anti-dots 1 and 2 so that charge e/4 is transferred from 1 to 2. There is now one charge −e/4 quasihole on each anti-dot. The state of the qubit is unaffected by this process. In order to flip this qubit, we now apply voltage to the front gates at A and B so that one charge e/4 quasiparticle tunnels between the edges. In order to ensure that only a single quasiparticle tunnels, it is useful to tune the voltage of the anti-dot at C and the backgate at A so that a single quasiparticle tunnels from the edge to the anti-dot at C. If the anti-dot is small, its charging energy will be too high to allow more than one quasiparticle to tunnel at once. We can then lower the voltage of the backgate at A so that no further tunneling can occur there and apply voltage to the backgate at B so that the quasiparticle can tunnel from C to B. By this two-step process, we can tunnel a single quasiparticle from A to B. If the $$v = \frac{5}{2}$$

plateau is in the phase of the Pfaffian state, this will transform |0> to |1>. This is our logical NOT operation. The gate which creates the anti-dot at C must be turned off at the beginning and end of the bit flip process so that there are no quasiparticles there either before or after which could become entangled with our qubit.

We can now measure our qubit again by tuning the front gates so that tunneling again occurs between M and N and between P and Q with amplitudes $t_{MN}$ and $t_{PQ}$. If, as expected, the qubit is now in the state |1> we will find $\sigma_{xx} \propto |t_{MN}-i\ t_{PQ}|^2$. On the other hand, if the $$v = \frac{5}{2}$$

state were Abelian, $\sigma_{xx}$ would not be affected by the motion of a quasiparticle from A to B.

In order to execute these steps, it is important that we know that we have one (modulo 4) charge −e/4 quasihole on each anti-dot. This can be ensured by measuring the tunneling conductance $G_t^{ad}$ from one edge to the other through each anti-dot. As we sweep the magnetic field, there will be a series of peaks in $G_t^{ad}$ corresponding to the passage through the Fermi level of quasihole states of the anti-dot. The spacing ΔB between states is determined by the condition that an additional state passes through the Fermi level when one additional half-flux-quantum, $$\frac{\Phi_0}{2}$$

is enclosed in the dot. Thus, the number of quasiholes is given simply by ⌊B/ΔB⌋. Alternatively, with a back gate, we could directly measure capacitatively the charge on each anti-dot. If the back gate voltage is $V_{BG}$ (relative to the zero quasihole case when the gate defining the anti-dot is turned off), then the charge on the anti-dot is $$q = \varepsilon V_{BG} A / d,$$

where $$A = \frac{\Phi_n}{2\Delta B}$$

is the area of the dot, o the dielectric constant, and d the distance between the back gate and the 2DEG.

Estimate of Error Rate. Bit flip and phase flip errors, respectively, occur when an uncontrolled charge −e/4 quasiparticle performs one of the two basic processes above: encircling one of the anti-dots (or passing from one edge to the other between them) or encircling both of them. The rate for these processes is related to the longitudinal resistivity (which vanishes within experimental accuracy) because it is limited by the density and mobility of excited quasiparticles. Even without considering the suppression factor associated with the latter (which depends on the ratio of the diffusion or hopping length, a, to the system size, L), we already have a strong upper bound on the error rate following from the thermally activated form of the former (in $k_B=1$ units):

$$\frac{\Gamma}{\Delta} \sim \frac{T}{\Delta} e^{-\Delta/T} < 10^{-30} \qquad (5)$$

Here, we have used the best current measured value for the quasiparticle gap $\Delta=500$mk of the 5/2 state and the lowest achieved measurement temperature T=5mK. For arbitrary braid-based computation, in a more elaborate device, it is sufficient if we further have $e^{\Delta/T} > \nu \Delta L^2$, where $\nu$ is the density-of-states. The effect of residual pinned quasiparticles can be diagnosed and accounted for in software. These error rates are substantially lower than the estimated error rate for any other physical implementations of quantum computation in any proposed architectures. Compared to other scalable solid state architectures, such as localized electron spin qubits in Si or GaAs nanostructures, where the estimated error rate is around $10^{-4}$ even in the best possible circumstances, the errors associated with $$\nu = \frac{5}{2}$$

quantum Hall anyons is essentially negligible. This miniscule error rate arises from the intrinsic robustness of the topological phase which is fundamentally immune to all local environmental perturbations.

The ideal error rate for the 5/2 state may actually be substantially lower than even this very low currently achievable value of $10^{-30}$. There is strong theoretical evidence that the ideal excitation gap (~2K) for the 5/2 quantum Hall state is much larger than the currently achieved gap value of 500mK. Using an ideal gap of 2K, we get an astronomically low error rate of $10^{-100}$. This expected higher value of $\Delta(\sim 2K)$ is consistent with the experimental development of the activation gap measurement of the 5/2 state. The early measurements on fairly modest quality samples (i.e., relatively highly disordered) gave $\Delta\sim 100$mK, whereas recent measurements in extremely high-quality (i.e., low disorder) samples give $\Delta\sim 300-500$mK. This implies that the 5/2 excitation gap is susceptible to strong suppression by disorder as has recently been theoretically argued. Since improvement in sample quality has already led to a factor of 5 enhancement in $\Delta$ (from 100mK to 500mK), it is not unreasonable to expect further improvements.

There are, in principle, other sources of error, but we expect them to be of minor significance. For example, if two quasiparticles come close to each other, then their mutual interaction leads to an error (e.g., through the exchange of a virtual particle). Such a virtual exchange is, however, a quantum tunneling process which should be exponentially suppressed. Therefore, keeping the quasiparticles reasonably far from each other should essentially eliminate this error.

We note that, although we have discussed only the 5/2 Pfaffian quantized Hall state throughout this paper, our considerations and arguments apply equally well to the experimentally often-observed 7/2 quantized Hall state which, being the "hole" analog of the 5/2 state by virtue of the particle-hole symmetry, should have equivalent topological and non-Abelian properties. We believe the 5/2 state to be a better experimental candidate for topological quantum computation because the measured excitation gap in the 5/2 state tends to be much higher than that in the 7/2 state. We should also mention that recently the 12/5 fractional quantum Hall state has been observed experimentally in the highest mobility sample at the lowest possible temperatures. This state, thought to be a non-Abelian state related to parafermions, is particularly exciting from the perspective of topological quantum computation because its braid group representation is dense in the unitary group making this state an ideal candidate for topological quantum computation. The measured gap value in the 12/5 state is currently rather small (~70mK). We expect that this is also strongly affected by disorder and that the eventual ideal gap at 12/5 will be much larger.

Example Computing Environment

Figure 3:
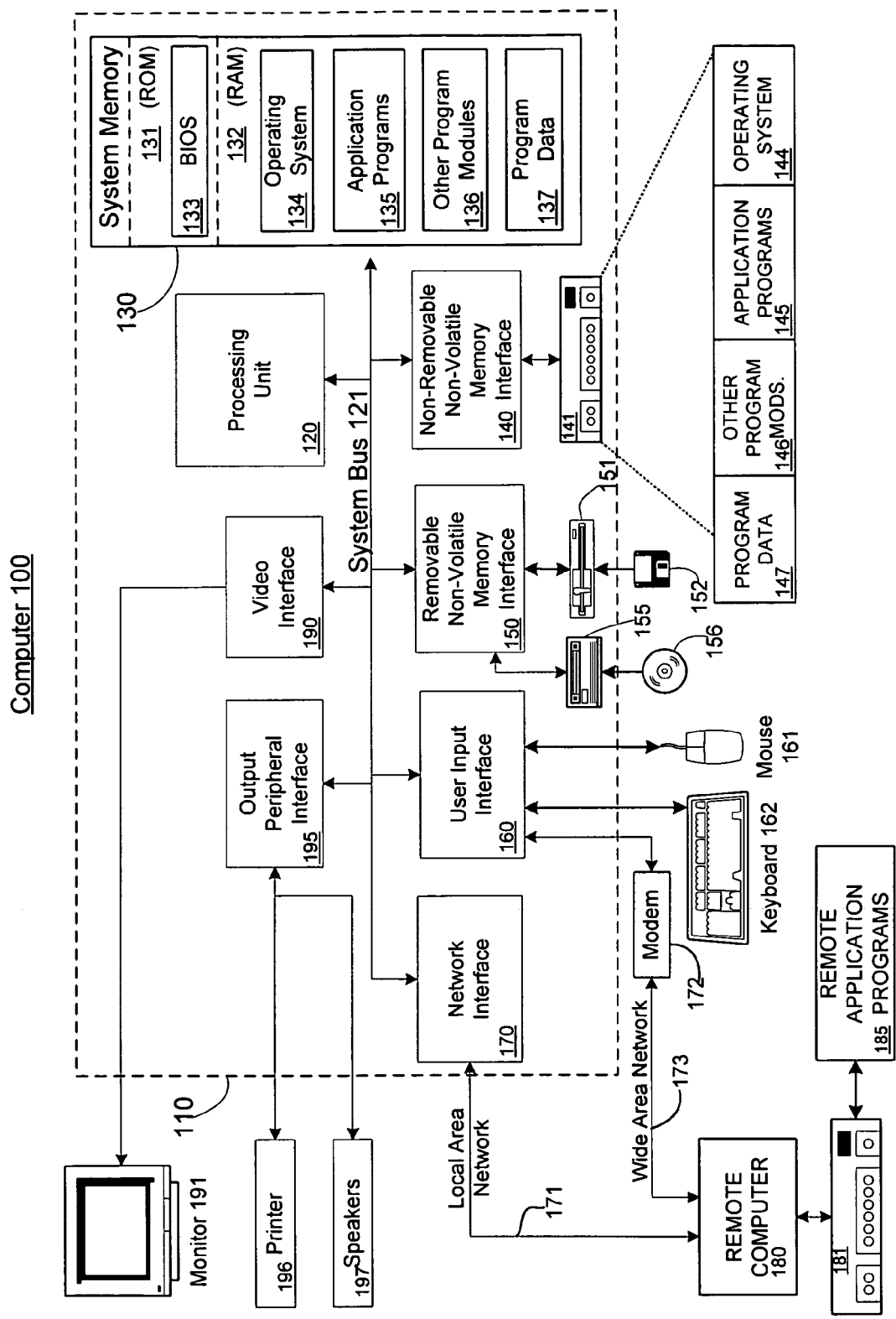
FIG. 3 is a block diagram showing an example computing environment in which aspects of the invention may be implemented.

FIG. 3 and the following discussion are intended to provide a brief general description of a suitable computing environment in which an example embodiment of the invention may be implemented. It should be understood, however, that handheld, portable, and other computing devices of all kinds are contemplated for use in connection with the present invention. While a general purpose computer is described below, this is but one example. The present invention also may be operable on a thin client having network server interoperability and interaction. Thus, an example embodiment of the invention may be implemented in an environment of networked hosted services in which very little or minimal client resources are implicated, e.g., a networked environment in which the client device serves merely as a browser or interface to the World Wide Web.

Although not required, the invention can be implemented via an application programming interface (API), for use by a developer or tester, and/or included within the network browsing software which will be described in the general context of computer-executable instructions, such as program modules, being executed by one or more computers (e.g., client workstations, servers, or other devices). Generally, program modules include routines, programs, objects, components, data structures and the like that perform particular tasks or implement particular abstract data types. Typically, the functionality of the program modules may be combined or distributed as desired in various embodiments. Moreover, those skilled in the art will appreciate that the invention may be practiced with other computer system configurations. Other well known computing systems, environments, and/or configurations that may be suitable for use with the invention include, but are not limited to, personal computers (PCs), automated teller machines, server computers, hand-held or laptop devices, multi-processor systems, microprocessor-based systems, programmable consumer electronics, network PCs, minicomputers, mainframe computers, and the like. An embodiment of the invention may also be practiced in distributed computing environments where tasks are performed by remote processing devices that are linked through a communications network or other data transmission medium. In a distributed computing environment, program modules may be located in both local and remote computer storage media including memory storage devices.

FIG. 3 thus illustrates an example of a suitable computing system environment 100 in which the invention may be implemented, although as made clear above, the computing system environment 100 is only one example of a suitable computing environment and is not intended to suggest any limitation as to the scope of use or functionality of the invention. Neither should the computing environment 100 be interpreted as having any dependency or requirement relating to any one or combination of components illustrated in the exemplary operating environment 100.

With reference to FIG. 3, an example system for implementing the invention includes a general purpose computing device in the form of a computer 110. Components of computer 110 may include, but are not limited to, a processing unit 120, a system memory 130, and a system bus 121 that couples various system components including the system memory to the processing unit 120. The system bus 121 may be any of several types of bus structures including a memory bus or memory controller, a peripheral bus, and a local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus (also known as Mezzanine bus).

Computer 110 typically includes a variety of computer readable media. Computer readable media can be any available media that can be accessed by computer 110 and includes both volatile and nonvolatile, removable and non-removable media. By way of example, and not limitation, computer readable media may comprise computer storage media and communication media. Computer storage media includes both volatile and nonvolatile, removable and non-removable media implemented in any method or technology for storage of information such as computer readable instructions, data structures, program modules or other data. Computer storage media includes, but is not limited to, random access memory (RAM), read-only memory (ROM), Electrically-Erasable Programmable Read-Only Memory (EEPROM), flash memory or other memory technology, compact disc read-only memory (CDROM), digital versatile disks (DVD) or other optical disk storage, magnetic cassettes, magnetic tape, magnetic disk storage or other magnetic storage devices, or any other medium which can be used to store the desired information and which can be accessed by computer 110. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, radio frequency (RF), infrared, and other wireless media. Combinations of any of the above should also be included within the scope of computer readable media.

The system memory 130 includes computer storage media in the form of volatile and/or nonvolatile memory such as ROM 131 and RAM 132. A basic input/output system 133 (BIOS), containing the basic routines that help to transfer information between elements within computer 110, such as during start-up, is typically stored in ROM 131. RAM 132 typically contains data and/or program modules that are immediately accessible to and/or presently being operated on by processing unit 120. By way of example, and not limitation, FIG. 3 illustrates operating system 134, application programs 135, other program modules 136, and program data 137. RAM 132 may contain other data and/or program modules.

The computer 110 may also include other removable/non-removable, volatile/nonvolatile computer storage media. By way of example only, FIG. 3 illustrates a hard disk drive 141 that reads from or writes to non-removable, nonvolatile magnetic media, a magnetic disk drive 151 that reads from or writes to a removable, nonvolatile magnetic disk 152, and an optical disk drive 155 that reads from or writes to a removable, nonvolatile optical disk 156, such as a CD ROM or other optical media. Other removable/non-removable, volatile/nonvolatile computer storage media that can be used in the example operating environment include, but are not limited to, magnetic tape cassettes, flash memory cards, digital versatile disks, digital video tape, solid state RAM, solid state ROM, and the like. The hard disk drive 141 is typically connected to the system bus 121 through a non-removable memory interface such as interface 140, and magnetic disk drive 151 and optical disk drive 155 are typically connected to the system bus 121 by a removable memory interface, such as interface 150.

The drives and their associated computer storage media discussed above and illustrated in FIG. 3 provide storage of computer readable instructions, data structures, program modules and other data for the computer 110. In FIG. 3, for example, hard disk drive 141 is illustrated as storing operating system 144, application programs 145, other program modules 146, and program data 147. Note that these components can either be the same as or different from operating system 134, application programs 135, other program modules 136, and program data 137. Operating system 144, application programs 145, other program modules 146, and program data 147 are given different numbers here to illustrate that, at a minimum, they are different copies. A user may enter commands and information into the computer 110 through input devices such as a keyboard 162 and pointing device 161, commonly referred to as a mouse, trackball or touch pad. Other input devices (not shown) may include a microphone, joystick, game pad, satellite dish, scanner, or the like. These and other input devices are often connected to the processing unit 120a-f through a user input interface 160 that is coupled to the system bus 121, but may be connected by other interface and bus structures, such as a parallel port, game port or a universal serial bus (USB).

A monitor 191 or other type of display device is also connected to the system bus 121 via an interface, such as a video interface 190. In addition to monitor 191, computers may also include other peripheral output devices such as speakers 197 and printer 196, which may be connected through an output peripheral interface 195.

The computer 110 may operate in a networked environment using logical connections to one or more remote computers, such as a remote computer 180. The remote computer 180 may be a personal computer, a server, a router, a network PC, a peer device or other common network node, and typically includes many or all of the elements described above relative to the computer 110, although only a memory storage device 181 has been illustrated in FIG. 3. The logical connections depicted in FIG. 3 include a local area network (LAN) 171 and a wide area network (WAN) 173, but may also include other networks. Such networking environments are commonplace in offices, enterprise-wide computer networks, intranets and the Internet.

When used in a LAN networking environment, the computer 110 is connected to the LAN 171 through a network interface or adapter 170. When used in a WAN networking environment, the computer 110 typically includes a modem 172 or other means for establishing communications over the WAN 173, such as the Internet. The modem 172, which may be internal or external, may be connected to the system bus 121 via the user input interface 160, or other appropriate mechanism. In a networked environment, program modules depicted relative to the computer 110, or portions thereof, may be stored in the remote memory storage device. By way of example, and not limitation, FIG. 3 illustrates remote application programs 185 as residing on memory device 181. It will be appreciated that the network connections shown are exemplary and other means of establishing a communications link between the computers may be used.

One of ordinary skill in the art can appreciate that a computer 110 or other client devices can be deployed as part of a computer network. In this regard, the present invention pertains to any computer system having any number of memory or storage units, and any number of applications and processes occurring across any number of storage units or volumes. An embodiment of the present invention may apply to an environment with server computers and client computers deployed in a network environment, having remote or local storage. The present invention may also apply to a standalone computing device, having programming language functionality, interpretation and execution capabilities.

Though the invention has been described in connection with certain preferred embodiments depicted in the various figures, it should be understood that other similar embodiments may be used, and that modifications or additions may be made to the described embodiments for practicing the invention without deviating therefrom. The invention, therefore, should not be limited to any single embodiment, but rather should be construed in breadth and scope in accordance with the following claims.

What is claimed is:

1. A method for implementing a NOT gate in a quantum computer, the method comprising:
   providing a logical gate for a quantum computer, said logical gate comprising first and second electrically-conductive gates disposed within a fractional quantum Hall effect (FQHE) fluid, the FQHE fluid having one or more anti-dots disposed therein; and
   affecting a collective state of the one or more anti-dots by adjusting a voltage between the first and second gates to cause a quasi-particle to tunnel between the first and second gates.

2. The method of claim 1, wherein the FQHE fluid is a $\nu=5/2$ quantum Hall effect fluid.

3. The method of claim 1, wherein the quasi-particle is an anyon.

4. The method of claim 1, wherein affecting the collective state of the one or more anti-dots comprises converting the collective state from a state carrying trivial SU(2)–charge $|1\rangle$ to a state carrying a fermionic SU(2) charge $|\in\rangle$.

5. The method of claim 1, wherein affecting the collective state of the one or more anti-dots comprises converting the collective state from a state carrying a fermionic SU(2)–charge $|\in\rangle$ to a state carrying trivial SU(2) charge $|1\rangle$.

6. A method for read out of a logical gate in a quantum computer, the method comprising:
   providing a fractional quantum Hall effect (FQHE) fluid having one or more anti-dots disposed therein;
   injecting an input current into a first edge of the FQHE fluid such that the input current forms at least two tunneling current paths, the anti-dots being disposed between the tunneling current paths;
   removing from a second edge of the FQHE fluid an output current that represents a combination of the tunneling currents; and
   determining from the output current a collective state of the one or more anti-dots.

7. The method of claim 6, further comprising:
   determining whether the collective state of the one or more anti-dots corresponds to a state carrying trivial SU(2)–charge $|1\rangle$.

8. The method of claim 6, further comprising:
   determining whether the collective state of the one or more anti-dots corresponds to a state carrying a fermionic SU(2) charge $|\in\rangle$.

* * * * *